(12) United States Patent
Kim et al.

(10) Patent No.: US 8,858,007 B2
(45) Date of Patent: Oct. 14, 2014

(54) DISPLAY DEVICES, AND DISPLAY AND ELECTRONIC SYSTEMS INCLUDING THE DISPLAY DEVICES

(75) Inventors: Young-Deuk Kim, Suwon-si (KR); Ji-Chul Kim, Yongin-si (KR); Se-Ran Bae, Yongin-si (KR); Eun-Seok Cho, Suwon-si (KR); Mi-Na Choi, Seoul (KR)

(73) Assignee: Samsung Electronics Co., Ltd (KR)

( * ) Notice: Subject to any disclaimer, the term of this patent is extended or adjusted under 35 U.S.C. 154(b) by 22 days.

(21) Appl. No.: 13/591,873

(22) Filed: Aug. 22, 2012

(65) Prior Publication Data

US 2013/0155653 A1     Jun. 20, 2013

(30) Foreign Application Priority Data

Dec. 16, 2011    (KR) .......................... 10-2011-0136302

(51) Int. Cl.
*G09F 13/04*       (2006.01)
*H05K 1/02*       (2006.01)

(52) U.S. Cl.
USPC ......... 362/97.1; 362/613; 362/97.3; 362/633; 362/634

(58) Field of Classification Search
USPC .................. 362/97.1–97.4, 613, 632–634
See application file for complete search history.

(56) References Cited

U.S. PATENT DOCUMENTS

| | | | |
|---|---|---|---|
| 6,534,722 B2 | 3/2003 | Takaoka | |
| 7,517,135 B2 * | 4/2009 | Yu ................................ | 362/633 |
| 8,540,411 B2 * | 9/2013 | Lee et al. ....................... | 362/606 |
| 2008/0094855 A1 * | 4/2008 | Yu et al. ....................... | 362/634 |

FOREIGN PATENT DOCUMENTS

| | | |
|---|---|---|
| JP | 2002351346 A | 12/2002 |
| JP | 2009014900 A | 1/2009 |
| KR | 20080067846 A | 7/2008 |

\* cited by examiner

*Primary Examiner* — Anabel Ton
(74) *Attorney, Agent, or Firm* — Harness, Dickey & Pierce, PLC

(57) ABSTRACT

A display device may include a chassis, a flexible printed circuit board on the chassis, a semiconductor device on the flexible printed circuit board, and a supporting element on the flexible printed circuit board. The semiconductor device may be spaced apart from the supporting element. The supporting element may be configured to maintain contact between the chassis and the flexible printed circuit board.

20 Claims, 13 Drawing Sheets

DISPLAY DEVICES, AND DISPLAY AND ELECTRONIC SYSTEMS INCLUDING THE DISPLAY DEVICES

CROSS-REFERENCE TO RELATED APPLICATION(S)

This application claims priority from Korean Patent Application No. 10-2011-0136302, filed on Dec. 16, 2011, in the Korean Intellectual Property Office (KIPO), the entire contents of which are incorporated herein by reference.

BACKGROUND

1. Field

Example embodiments relate to display devices including flexible printed circuit boards on which semiconductor devices are mounted.

2. Description of Related Art

Generally, a display device includes a flat panel display device (FPD) such as a liquid crystal display device (LCD) and an organic light emitting diode display device (OLED). The flat display device includes a display assembly that implements images and a chassis that covers side surfaces of the display assembly. The display assembly may include a flexible printed circuit board on which a semiconductor device is mounted on a first surface.

SUMMARY

Example embodiments may provide display devices capable of improving reliability and/or stability by improving heat dissipation efficiency of semiconductor devices mounted on flexible printed circuit boards. Example embodiments also may provide display systems including the display devices and/or electronic systems including the display devices.

In some example embodiments, a display device may include a display assembly including a flexible printed circuit board and a semiconductor device, the flexible printed circuit board including a first surface and a second surface, the second surface being opposite to the first surface, the semiconductor device being mounted on the first surface of the flexible printed circuit board; a chassis configured to cover a side surface of the display assembly, the chassis being in contact with the second surface of the flexible printed circuit board; and/or a supporting element attached to the first surface of the flexible printed circuit board, the supporting element being in contact with the display assembly.

In some example embodiments, the flexible printed circuit board may further include a first region including a first terminal, a second region including a second terminal, and/or a mounting region between the first region and the second region. The semiconductor device may be mounted on the first surface of the mounting region. The chassis may be in contact with the second surface of the mounting region.

In some example embodiments, the display assembly may further include a display panel connected to the first terminal and/or a driving circuit board connected to the second terminal. The driving circuit board may be on a rear surface of the display panel.

In some example embodiments, the display assembly may further include a back-light assembly between the display panel and the driving circuit board, and/or a mold frame configured to receive the back-light assembly. The supporting element may be in contact with a side surface of the mold frame.

In some example embodiments, the supporting element may include a supporting body and/or an adhesive layer. The adhesive layer may be between the supporting body and the first surface of the flexible printed circuit board.

In some example embodiments, the supporting element may include elastic material.

In some example embodiments, the supporting element may include at least one air path.

In some example embodiments, a display device may include a flexible printed circuit board including a first surface and a second surface, the second surface being opposite to the first surface; a semiconductor device mounted on the first surface of the flexible printed circuit board; a display panel connected to an end side of the flexible printed circuit board; a driving circuit board connected to another end side of the flexible printed circuit board; a chassis configured to cover a side surface of the display panel, the chassis being in contact with the second surface of the flexible printed circuit board; and/or a first supporting element between the first surface of the flexible printed circuit board and the display panel, the first supporting element being spaced apart from the semiconductor device.

In some example embodiments, the semiconductor device may include a first side surface toward the end side of the flexible printed circuit board, a second side surface opposite to the first side surface, a third side surface toward a lateral side surface of the flexible printed circuit board, and/or a fourth side surface opposite to the third side surface. The first supporting element may be near the first side surface of the semiconductor device.

In some example embodiments, the display device may further include a second supporting element near the second side surface of the semiconductor device.

In some example embodiments, the second supporting element may be symmetrical to the first supporting element based on an imaginary line that divides the semiconductor device in half in a horizontal direction.

In some example embodiments, the display device may further include a third supporting element near the first side surface of the semiconductor device; and/or a fourth supporting element near the second side surface of the semiconductor device. The third supporting element may be spaced apart from the first supporting element. The fourth supporting element may be spaced apart from the second supporting element.

In some example embodiments, the third and fourth supporting elements may be symmetrical to the first and second supporting elements based on an imaginary line that divides the semiconductor device in half in a vertical direction.

In some example embodiments, a vertical distance between the first supporting element and the first side surface of the semiconductor device may be smaller than a vertical distance between the first supporting element and the display panel.

In some example embodiments, a horizontal length of the first supporting element may be greater than a horizontal length of the semiconductor device.

In some example embodiments, a display device may include a chassis, a flexible printed circuit board on the chassis, a semiconductor device on the flexible printed circuit board, and/or a supporting element on the flexible printed circuit board. The semiconductor device may be spaced apart from the supporting element. The supporting element may be configured to maintain contact between the chassis and the flexible printed circuit board.

In some example embodiments, the flexible printed circuit board may include a first surface and a second surface, the supporting element may be on the first surface, and/or the supporting element may be configured to maintain contact between the chassis and the second surface of the flexible printed circuit board.

In some example embodiments, the flexible printed circuit board may include a first surface and a second surface, the semiconductor device may be on the first surface, and/or the supporting element may be configured to maintain contact between the chassis and the second surface of the flexible printed circuit board.

In some example embodiments, a display system may include the display device.

In some example embodiments, an electronic system may include the display device.

BRIEF DESCRIPTION OF THE DRAWINGS

The above and/or other aspects and advantages will become more apparent and more readily appreciated from the following detailed description of example embodiments, taken in conjunction with the accompanying drawings, in which.

DETAILED DESCRIPTION

Figure 1:
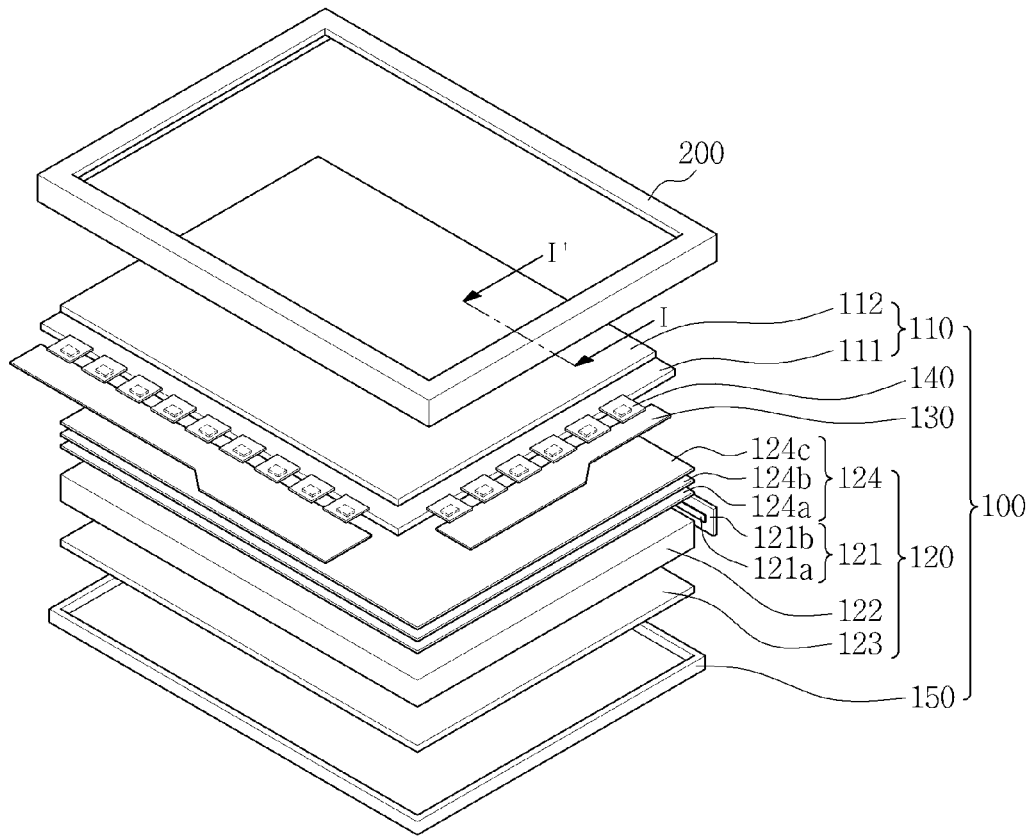
FIG. 1 is an exploded perspective view illustrating a display device in accordance with some example embodiments.

Example embodiments will now be described more fully with reference to the accompanying drawings. Embodiments, however, may be embodied in many different forms and should not be construed as being limited to the embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that when an element is referred to as being "on," "connected to," "electrically connected to," or "coupled to" to another component, it may be directly on, connected to, electrically connected to, or coupled to the other component or intervening components may be present. In contrast, when a component is referred to as being "directly on," "directly connected to," "directly electrically connected to," or "directly coupled to" another component, there are no intervening components present. As used herein, the term "and/or" includes any and all combinations of one or more of the associated listed items.

It will be understood that although the terms first, second, third, etc., may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. For example, a first element, component, region, layer, and/or section could be termed a second element, component, region, layer, and/or section without departing from the teachings of example embodiments.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting of example embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Reference will now be made to example embodiments, which are illustrated in the accompanying drawings, wherein like reference numerals may refer to like components throughout.

First Embodiment

Figure 2:
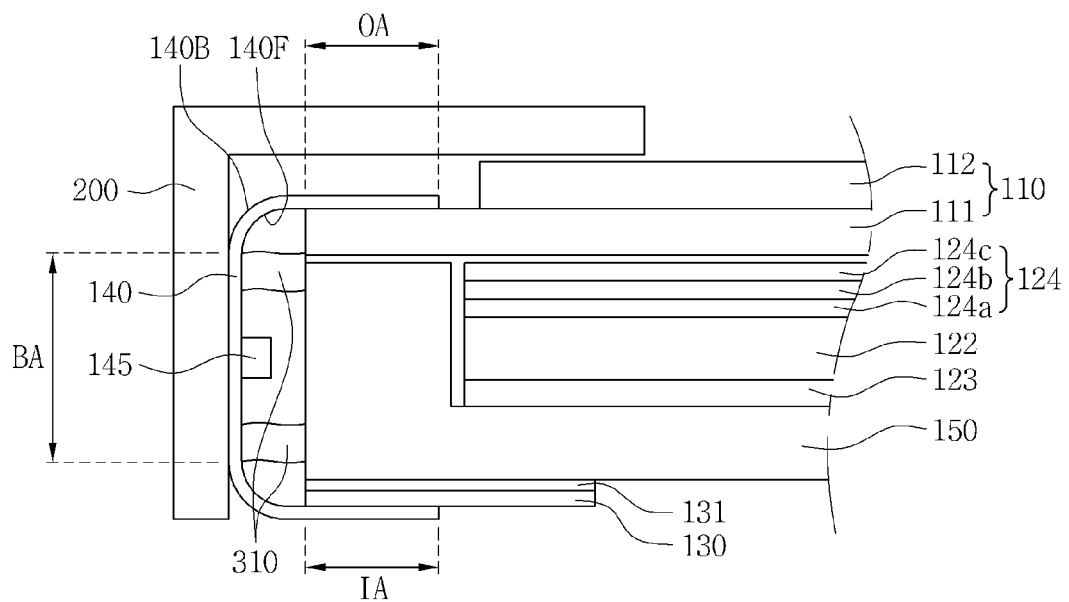
FIG. 2 is a cross-sectional view taken along line I-I' of FIG. 1.
Figure 3:
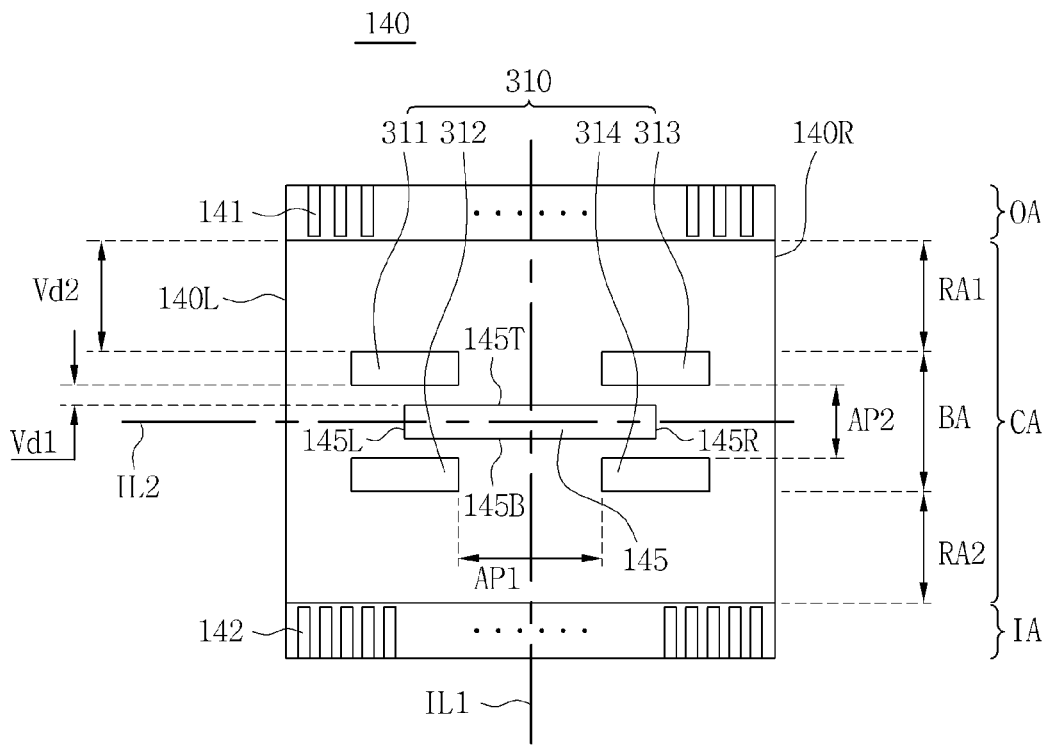
FIG. 3 is a plan view illustrating a flexible printed circuit board and a supporting element of a display device in accordance with some example embodiments.

FIG. 1 is an exploded perspective view illustrating a display device in accordance with a first embodiment of the inventive concept. FIG. 2 is a cross-sectional view taken along line I-I' of FIG. 1. FIG. 3 is a plan view illustrating a flexible printed circuit board and a supporting element of a display device in accordance with a first embodiment of the inventive concept.

Referring to FIGS. 1 to 3, the display device in accordance with the first embodiment of the inventive concept may include a display assembly 100 having a flexible printed circuit board (FPCB) 140 and a semiconductor device 145, a chassis 200 configured to cover a side surface of the display assembly 100, and a plurality of supporting elements 310 attached onto a first surface 140F of the flexible printed circuit board 140. The semiconductor device 145 may be mounted on the first surface 140F of the flexible printed circuit board 140. The plurality of supporting elements 310 may be spaced apart from the semiconductor device 145.

The display assembly 100 may implement certain images using an image signal transferred from the outside. The display assembly 100 may further include a display panel 110 connected to a first end side of the flexible printed circuit board 140, a back-light assembly 120 disposed under the display panel 110, a driving circuit board 130 connected to a second end side of the flexible printed circuit board 140, and a mold frame 150 configured to receive the back-light assembly 120.

The display panel 110 may implement the certain images by selectively transmitting light. The display panel 110 may include a first board 111 disposed near to the back-light assembly 120, and a second board 112 coupled with the first board 111.

The first board 111 may include a plurality of thin film transistors (TFTs). The plurality of thin film transistors may be arranged in a matrix type. The plurality of thin film transistors may be controlled by a driving signal. The first board 111 may be electrically connected to the driving circuit board 130. The first board 111 may be in contact with the first end side of the flexible printed circuit board 140. The first board 111 may have a larger area than the second board 112. The second board 112 may include a color filter (CF) that can implement at least two colors.

A material, which can selectively transmit light according to the driving signal, may be disposed between the first board 111 and the second board 112. For example, a liquid crystal may be disposed between the first board 111 and the second board 112. The display panel 110 may be a liquid crystal panel.

The back-light assembly 120 may supply light having uniform luminance and directional property to the display panel 110. The back-light assembly 120 may include a light source part 121, a light guide plate 122 disposed at a side of the light source part 121, a reflecting plate 123 disposed under the light guide plate 122, and at least one optical sheet 124 disposed over the light guide plate 122.

The light source part 121 may supply light to the light guide plate 122. The light source part 121 may include a light source 121a configured to emit light, and a light source board 121b on which the light source 121a is mounted. The light source 121a may include at least one point light source. For example, the light source 121a may include at least one light emitting diode (LED). The light source board 121b may include a printed circuit board (PCB).

The light source 121a may have a top view type. The light source 121a may emit light upward. A top surface of the light source 121a may face a side surface of the light guide plate 122. The light source board 121b may be parallel to the side surface of the light guide plate 122.

The light guide plate 122 may supply light to the entire lower surface of the display panel 110. The light guide plate 122 may control optical distribution of light supplied from the light source part 121. The light guide plate 122 may function as a surface light source for the display panel 110.

The reflecting plate 123 may reflect light emitted to a lower portion of the light guide plate 122. The reflecting plate 123 may supply all the light emitted from the light guide plate 122 to the display panel 110. The reflecting plate 123 can improve light efficiency of the back-light assembly 120.

The at least one optical sheet 124 may control characteristics of the light supplied to the display panel 110. The at least one optical sheet 124 may supply light having uniform luminance and directional property to the display panel 110. The at least one optical sheet 124 may have the same area as a substantial display area of the display panel 110. For example, the at least one optical sheet 124 may have the same area as the second board 112 of the display panel 110. The at least one optical sheet 124 may include a diffuser sheet 124a, a prism sheet 124b, and a protecting sheet 124c, which are sequentially stacked.

The diffuser sheet 124a may diffuse light emitted to an upper portion of the light guide plate 122. The diffuser sheet 124a may allow the light supplied to the display panel 110 to have uniform luminance. The prism sheet 124b may allow the light diffused by the diffuser sheet 124a to have a direction perpendicular to a rear surface of the display panel 110. The protecting sheet 124c may prevent damage of the diffuser sheet 124a and the prism sheet 124b.

The driving circuit board 130 may receive an image signal from the outside to generate a driving signal. The driving circuit board 130 may apply the driving signal to the display panel 110. The driving circuit board 130 may be electrically connected to the other side of the flexible printed circuit board 140. The driving circuit board 130 may be attached to a lower portion of the mold frame 150. An adhesive element 131 may be disposed between the driving circuit board 130 and the mold frame 150. The adhesive element 131 may include a double-sided tape. The driving circuit board 130 may include a printed circuit board.

The flexible printed circuit board 140 may electrically connect the display panel 110 and the driving circuit board 130. The flexible printed circuit board 140 may include the first surface 140F and a second surface 140B opposite to the first surface 140F. The first surface 140F of the flexible printed circuit board 140 may face a side surface of the back-light assembly 120. The second surface 140B of the flexible printed circuit board 140 may be in contact with the chassis 200.

The flexible printed circuit board 140 may include a first region OA disposed at the first end, a second region IA disposed at the second end, and a third region CA disposed between the first region OA and the second region IA. The flexible printed circuit board 140 may further include a first terminal 141 disposed in the first region OA and a second terminal 142 disposed in the second region IA.

The first terminal 141 may be connected to the display panel 110. The first terminal 141 may be an output terminal configured to output the driving signal to the display panel 110. The second terminal 142 may be connected to the driving circuit board 130. The second terminal 142 may be an input terminal to which the driving signal from the driving circuit board 130 is input.

The third region CA may include a mounting region BA in which the second surface 140B is in contact with the chassis 200, a first rounding region RA1 disposed between the mounting region BA and the first region OA, and a second rounding region RA2 disposed between the mounting region BA and the second region IA. The semiconductor device 145 may be mounted on the first surface 140F of the mounting region BA.

The semiconductor device 145 may control the driving signal applied to the display panel 110. The semiconductor device 145 may include a driving integrated circuit (IC).

The semiconductor device 145 may include a first side surface 145T disposed toward the first region OA of the flexible printed circuit board 140, a second side surface 145B disposed toward the second region IA of the flexible printed circuit board 140, a third side surface 145L disposed toward a left side surface 140L of the flexible printed circuit board 140, and a fourth side surface 145R disposed toward a right side surface 140R of the flexible printed circuit board 140. The second side surface 145B is opposite to the first side surface 145T. The fourth side surface 145R is opposite to the third side surface 145L. Herein, the left side surface 140L and the right side surface 140R of the flexible printed circuit board 140 may be defined in FIG. 3.

The side surfaces of the semiconductor device 145 may be parallel to the side surfaces of the flexible printed circuit board 140. The semiconductor device 145 may be a quadrangle having four side surfaces parallel to the side surfaces of the flexible printed circuit board 140. For example, the semiconductor device 145 may have a rectangular shape having long side surfaces parallel to boundaries between the mounting region BA and the first rounding region RA1 and the second rounding region RA2. The semiconductor device 145 may have a rectangular shape in which the first and second side surfaces 145T and 145B are longer than the third and fourth side surfaces 145L and 145R.

The mold frame 150 may receive the back-light assembly 120. The mold frame 150 may be disposed between the back-light assembly 120 and the driving circuit board 130. The mold frame 150 may have substantially the same area as the display panel 110. For example, the mold frame 150 may have the same area as that of the first board 111. The side surfaces of the mold frame 150 may be aligned perpendicular to the side surfaces of the display panel 110.

The chassis 200 may prevent damage of the display panel 110. The chassis 200 may cover the side surfaces of the display panel 110. The chassis 200 may cover upper edges of the display panel 110. For example, the chassis 200 may cover edges of the second board 112 of the display panel 110. The chassis 200 may be in contact with the second surface 140B of the flexible printed circuit board 140. The chassis 200 may be in contact with the second surface 140B of the mounting region BA of the flexible printed circuit board 140. The chassis 200 may be formed of metal materials. For example, the chassis 200 may be formed of aluminum. The chassis 200 may absorb heat from the semiconductor device 145 through the flexible printed circuit board 140.

The plurality of supporting elements 310 may allow the second surface 140B of the flexible printed circuit board 140 to be in contact with the chassis 200. The plurality of supporting elements 310 may allow the flexible printed circuit board 140 to maintain a certain shape, regardless of an elastic force of the flexible printed circuit board 140. For example, the plurality of supporting elements 310 may maintain a space between the flexible printed circuit board 140 and the back-light assembly 120.

The plurality of supporting elements 310 may be in contact with the display assembly 100. For example, the plurality of supporting elements 310 may be in contact with the side surfaces of the display assembly 100. The plurality of supporting elements 310 may be in contact with the side surfaces of the mold frame 150 of the display assembly 100. Each supporting element 310 may be thicker than the semiconductor device 145. The thickness of each supporting element 310 may be the same as a distance between the first surface 140F of the flexible printed circuit board 140 and the side surface of the display assembly 100. For example, the semiconductor device 145 may be spaced apart from the side surface of the display assembly 100.

The plurality of supporting elements 310 may have the same shape as the semiconductor device 145. For example, the plurality of supporting elements 310 may have a rectangular shape. The plurality of supporting elements 310 may have a rectangular shape in which the side surfaces parallel to the first side surface 145T and the second side surface 145B of the semiconductor device 145 are long. Some regions of the plurality of supporting elements 310 may overlap the semiconductor device 145. The plurality of supporting elements 310 may include a first supporting element 311, a second supporting element 312, a third supporting element 313 and a fourth supporting element 314 which are spaced apart from one another.

The first to fourth supporting elements 311 to 314 may surround the side surfaces of the semiconductor device 145. For example, the first to fourth supporting elements 311 to 314 may be disposed at each corner of the semiconductor device 145.

The first supporting element 311, the second supporting element 312, the third supporting element 313 and the fourth supporting element 314 may have the same shape. The first and third supporting elements 311 and 313 may be disposed near to the first side surface 145T of the semiconductor device 145. The third supporting element 313 may be spaced apart from the first supporting element 311. For example, the first supporting element 311 may overlap the third side surface 145L of the semiconductor device 145, and the third supporting element 313 may overlap the fourth side surface 145R of the semiconductor device 145. The first supporting element 311 may be disposed near to a left upper corner of the semiconductor device 145. The third supporting element 313 may be disposed near to a right upper corner of the semiconductor device 145. Herein, the left and right upper corners of the semiconductor device 145 may be defined in FIG. 3.

The second and fourth supporting elements 312 and 314 may be disposed near to the second side surface 145B of the semiconductor device 145. The second and fourth supporting elements 312 and 314 may be disposed parallel to the second side surface 145B of the semiconductor device 145.

The fourth supporting element 314 may be spaced apart from the second supporting element 312. For example, the second supporting element 312 may overlap the third side surface 145L of the semiconductor device 145 and the fourth supporting element 314 may overlap the fourth side surface 145R of the semiconductor device 145. The second supporting element 312 may be disposed near to the left lower corner of the semiconductor device 145. The fourth supporting element 314 may be disposed near to the right lower corner of the semiconductor device 145. Herein, the left and right lower corners of the semiconductor device 145 may be defined in FIG. 3.

The first and second supporting elements 311 and 312 may be symmetrically disposed to the third and fourth supporting elements 313 and 314 based on a first imaginary line IL1 that divides the semiconductor device 145 in half in a vertical direction. The first imaginary line IL1 may pass over a central point of the semiconductor device 145.

In addition, the first and third supporting elements 311 and 313 may be symmetrically disposed to the second and fourth supporting elements 312 and 314 based on a second imaginary line IL2 that divides the semiconductor device 145 in half in a horizontal direction. The second imaginary line IL2 may pass over the central point of the semiconductor device 145. The central point of the semiconductor device 145 may be an intersecting point of the first imaginary line IL1 and the second imaginary line IL2.

Spaces between the first and second supporting elements 311 and 312, and between the third and fourth supporting elements 313 and 314 may function as air paths. Spaces between the first and third supporting elements 311 and 313, and between the second and fourth supporting elements 312 and 314 may function as air paths. The plurality of supporting elements 410 may include a first air path AP1 that passes the semiconductor device 145 in a vertical direction, and a second air path AP2 that passes the semiconductor device 145 in a horizontal direction.

The plurality of supporting elements 310 may define regions of the flexible printed circuit board 140 that are in contact with the chassis 200. The mounting region BA of the flexible printed circuit board 140 may be defined by the plurality of supporting elements 310. A space between the first supporting element 311 and the first region OA of the flexible printed circuit board 140 may be the first rounding region RA1. A vertical distance Vd1 between the first supporting element 311 and the semiconductor device 145 may be smaller than a vertical distance Vd2 between the first supporting element 311 and the first region OA of the flexible printed circuit board 140.

Second Embodiment

Figure 4:
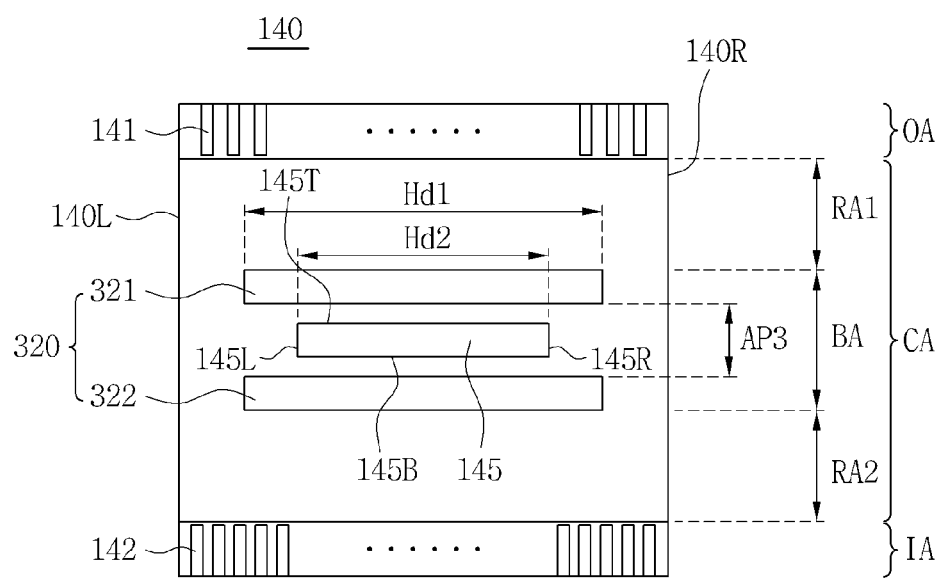
FIG. 4 is a plan view illustrating a flexible printed circuit board and a supporting element of a display device in accordance with some example embodiments.

FIG. 4 is a plan view illustrating a flexible printed circuit board and a supporting element of a display device in accordance with a second embodiment of the inventive concept.

Hereinafter, with reference to FIG. 4, a display device according to a second embodiment of the inventive concept will be described based on the differences in the display device according to the first embodiment of the inventive concept. Accordingly, a detailed description of the same or similar components in the display device according to the first embodiment of the inventive concept will be omitted.

Referring to FIG. 4, the display device according to the second embodiment of the inventive concept may include a flexible printed circuit board 140 on which a semiconductor device 145 is mounted, and a plurality of supporting elements 320 attached onto the flexible printed circuit board 140.

The plurality of supporting elements 320 may include a fifth supporting element 321 disposed near to a first side surface 145T of the semiconductor device 145, and a sixth supporting element 322 disposed near to a second side surface 145B of the semiconductor device 145. The fifth supporting element 321 may be disposed parallel to the first side surface 145T of the semiconductor device 145. The sixth supporting element 322 may be disposed parallel to the second side surface 145B of the semiconductor device 145. The fifth and sixth supporting elements 321 and 322 may have the same shape.

A space between the fifth supporting element 321 and the sixth supporting element 322 may function as an air path. The plurality of supporting elements 320 may include a third air path AP3 that passes over the semiconductor device 145 in a horizontal direction.

The fifth supporting element 321 may have a first horizontal length Hd1. The first side surface 145T of the semiconductor device 145 may have a second horizontal length Hd2. The horizontal length Hd1 may be greater than the horizontal length Hd2. The horizontal length of the sixth supporting member 322 may be the same as that of the fifth supporting element 321. The sixth supporting element 322 may have a greater horizontal length than the second side surface 145B of the semiconductor device 145.

Third Embodiment

Figure 5:
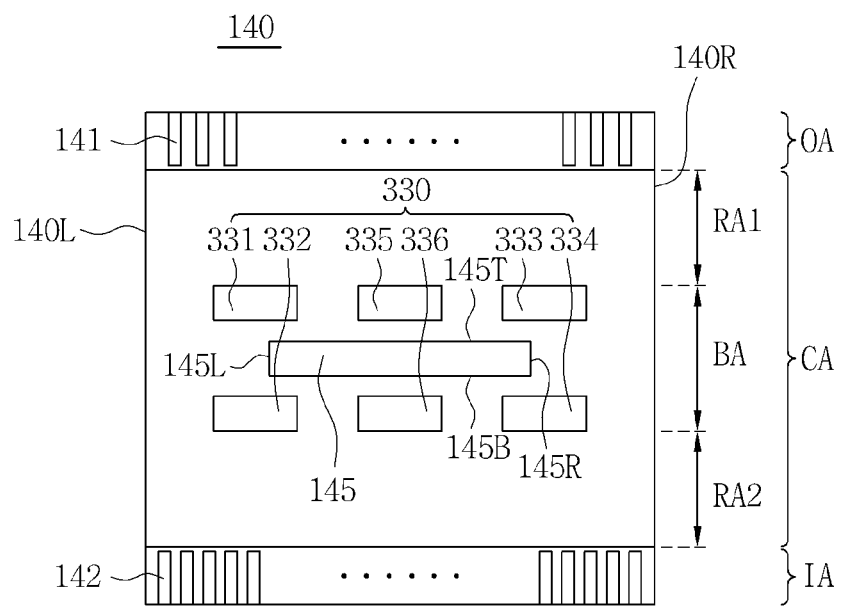
FIG. 5 is a plan view illustrating a flexible printed circuit board and a supporting element of a display device in accordance with some example embodiments.

FIG. 5 is a plan view illustrating a flexible printed circuit board and a supporting element of a display device in accordance with a third embodiment of the inventive concept.

Hereinafter, with reference to FIG. 5, a display device according to a third embodiment of the inventive concept will be described based on the differences in the display device according to the first embodiment of the inventive concept. Accordingly, a detailed description of the same or similar components in the display device according to the first embodiment of the inventive concept will be omitted.

Referring to FIG. 5, the display device according to the third embodiment of the inventive concept may include a flexible printed circuit board 140 on which a semiconductor device 145 is mounted, and a plurality of supporting elements 330 attached to the flexible printed circuit board 140.

The plurality of supporting elements 330 may include a seventh supporting element 331, an eighth supporting element 332, a ninth supporting element 333, and a tenth supporting element 334 disposed at each corner of the semiconductor device 145. The plurality of supporting elements 330 may further include an eleventh supporting element 335 disposed near to a first side surface 145T of the semiconductor device 145, and a twelfth supporting element 336 disposed near to a second side surface 145B of the semiconductor device 145. The eleventh supporting element 335 and the twelfth supporting element 336 may have the same shape as the seventh supporting element 331, the eighth supporting element 332, the ninth supporting element 333 and the tenth supporting element 334.

The eleventh supporting element 335 may be disposed between the seventh supporting element 331 and the ninth supporting element 333. The twelfth supporting element 336 may be disposed between the eighth supporting element 332 and the tenth supporting element 334.

Spaces between the seventh and eleventh supporting elements 331 and 335, between the eleventh and ninth supporting elements 335 and 333, between the eighth and twelfth supporting elements 332 and 336, and between the twelfth and tenth supporting elements 336 and 334 may function as air paths that pass over the semiconductor device 145 in a vertical direction. The plurality of supporting elements 330 may include two air paths that pass over the semiconductor device 145 in the vertical direction.

Spaces between the seventh and eighth supporting elements 331 and 332, between the ninth and tenth supporting elements 333 and 334, and between the eleventh and twelfth supporting elements 335 and 336 may function as air paths that pass over the semiconductor device 145 in a horizontal direction.

Fourth Embodiment

Figure 6:
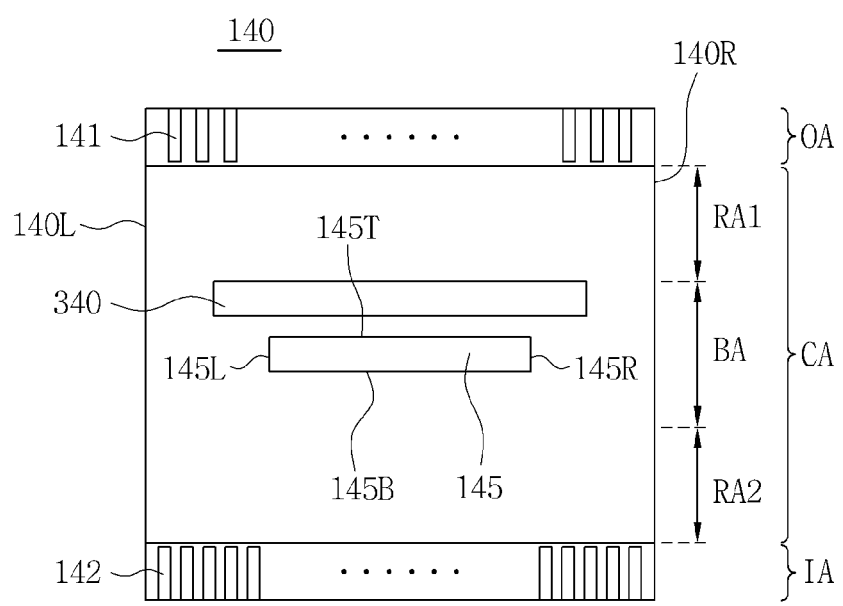
FIG. 6 is a plan view illustrating a flexible printed circuit board and a supporting element of a display device in accordance with some example embodiments.

FIG. 6 is a plan view illustrating a flexible printed circuit board and a supporting element of a display device in accordance with a fourth embodiment of the inventive concept.

Hereinafter, with reference to FIG. 6, a display device according to a fourth embodiment of the inventive concept will be described based on the differences in the display device according to the first embodiment of the inventive concept. Accordingly, a detailed description of the same or similar components in the display device according to the first embodiment of the inventive concept will be omitted.

Referring to FIG. 6, the display device according to the fourth embodiment of the inventive concept may include a flexible printed circuit board 140 on which a semiconductor device 145 is mounted, and a thirteenth supporting element 340 attached to the flexible printed circuit board 140.

The thirteenth supporting element 340 may be disposed near to a first side surface 145T of the semiconductor device 145. A horizontal length of the thirteenth supporting element 340 may be greater than the first side surface 145T of the semiconductor device 145. The thirteenth supporting element 340 may be parallel with the first side surface 145T of the semiconductor device 145. The thirteenth supporting element 340 may be arranged abreast of the first side surface 145T of the semiconductor device 145.

Fifth Embodiment

Figure 7:
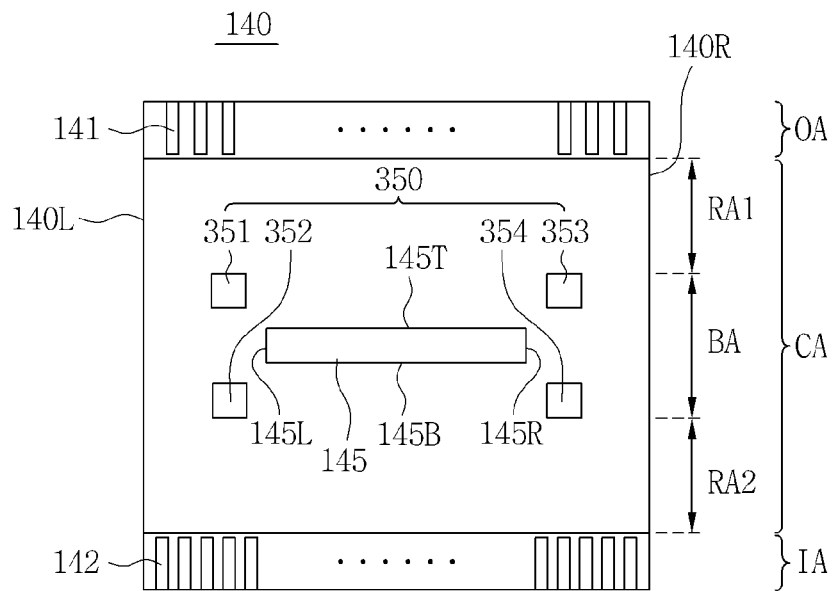
FIG. 7 is a plan view illustrating a flexible printed circuit board and a supporting element of a display device in accordance with some example embodiments.

FIG. 7 is a plan view illustrating a flexible printed circuit board and a supporting element of a display device in accordance with a fifth embodiment of the inventive concept.

Hereinafter, with reference to FIG. 7, a display device according to a fifth embodiment of the inventive concept will be described based on the differences in the display device according to the first embodiment of the inventive concept. Accordingly, a detailed description of the same or similar components in the display device according to the first embodiment of the inventive concept will be omitted.

Referring to FIG. 7, the display device according to the fifth embodiment of the inventive concept may include a flexible printed circuit board 140 on which a semiconductor device 145 is mounted, and a plurality of supporting elements 350 attached to the flexible printed circuit board 140.

The plurality of supporting elements 350 may include a fourteenth supporting element 351, a fifteenth supporting element 352, a sixteenth supporting element 353, and a seventeenth supporting element 354 disposed at each corner of the semiconductor device 145. The fourteenth supporting element 351, the fifteenth supporting element 352, the sixteenth supporting element 353, and the seventeenth supporting element 354 may not overlap a first side surface 145T, a second side surface 145B, a third side surface 145L and a fourth side surface 145R of the semiconductor device 145. The semiconductor device 145 may be entirely exposed to the air paths that pass over the semiconductor device 145.

The fourteenth to seventeenth supporting elements 351 to 354 may have the same shape. For example, the fourteenth to seventeenth supporting elements 351 to 354 may have a rectangular shape.

Sixth Embodiment

Figure 8:
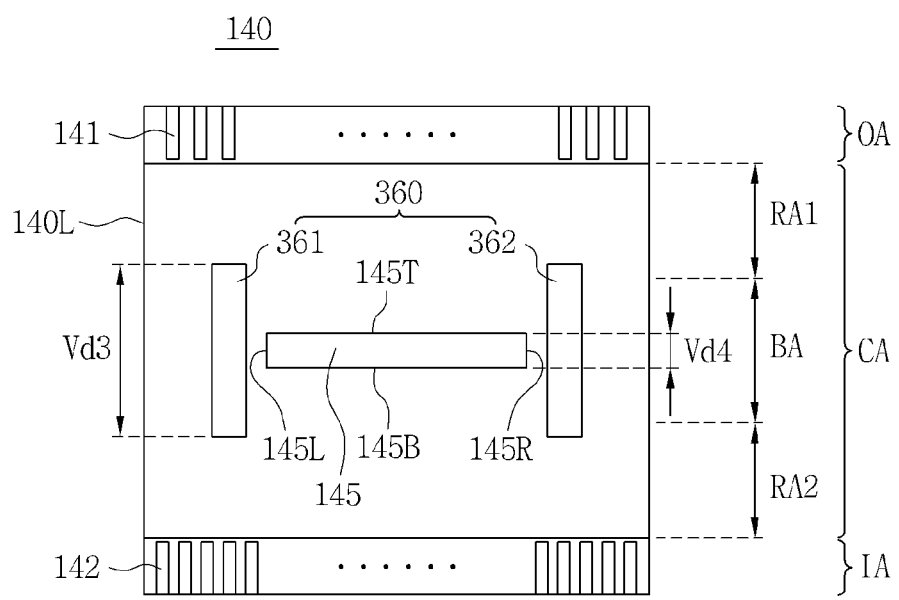
FIG. 8 is a plan view illustrating a flexible printed circuit board and a supporting element of a display device in accordance with some example embodiments.

FIG. 8 is a plan view illustrating a flexible printed circuit board and a supporting element of a display device in accordance with a sixth embodiment of the inventive concept.

Hereinafter, with reference to FIG. 8, a display device according to a sixth embodiment of the inventive concept will be described based on the differences in the display device according to the first embodiment of the inventive concept. Accordingly, a detailed description of the same or similar components in the display device according to the first embodiment of the inventive concept will be omitted.

Referring to FIG. 8, the display device according to the sixth embodiment of the inventive concept may include a flexible printed circuit board 140 on which a semiconductor device 145 is mounted, and a plurality of supporting elements 360 attached to the flexible printed circuit board 140.

The plurality of supporting elements 360 may include an eighteenth supporting element 361 disposed near to a third side surface 145L of the semiconductor device 145, and a nineteenth supporting element 362 disposed near to a fourth side surface 145R of the semiconductor device 145. The eighteenth supporting element 361 may be disposed parallel to the third side surface 145L of the semiconductor device 145. The nineteenth supporting element 362 may be disposed parallel to the fourth side surface 145R of the semiconductor device 145. The eighteenth and nineteenth supporting elements 361 and 362 may have the same shape. A space between the eighteenth supporting element 361 and the nineteenth supporting element 362 may function as an air path that passes over the semiconductor device 145 in a vertical direction.

The eighteenth supporting element 361 may have a third vertical length Vd3. The third side surface 145L and the fourth side surface 145R of the semiconductor device 145 may have a fourth vertical length Vd4. The third vertical length Vd3 may be greater than the fourth vertical length Vd4. For example, the third vertical length Vd3 may be the same as that of a mounting region BA of the flexible printed circuit board 140.

Seventh Embodiment

Figure 9:
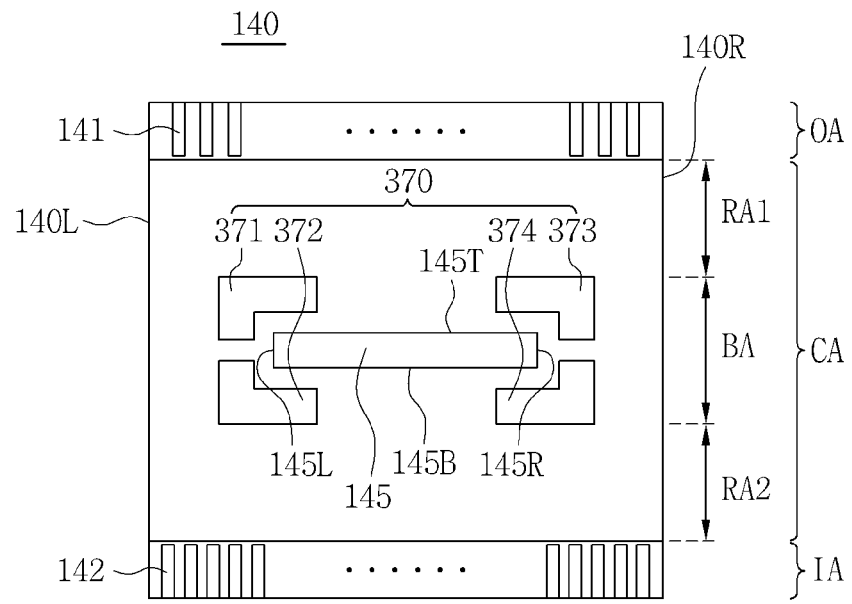
FIG. 9 is a plan view illustrating a flexible printed circuit board and a supporting element of a display device in accordance with some example embodiments.

FIG. 9 is a plan view illustrating a flexible printed circuit board and a supporting element of a display device in accordance with a seventh embodiment of the inventive concept.

Hereinafter, with reference to FIG. 9, a display device according to a seventh embodiment of the inventive concept will be described based on the differences in the display device according to the first embodiment of the inventive concept. Accordingly, a detailed description of the same or similar components in the display device according to the first embodiment of the inventive concept will be omitted.

Referring to FIG. 9, the display device according to the seventh embodiment of the inventive concept may include a flexible printed circuit board 140 on which a semiconductor device 145 is mounted, and a plurality of supporting elements 370 attached to the flexible printed circuit board 140.

The plurality of supporting elements 370 may include a twentieth supporting element 371, a twenty-first supporting element 372, a twenty-second supporting element 373, and a twenty-third supporting element 374 disposed at each corner of the semiconductor device 145. The twentieth to twenty-third supporting elements 371 to 374 may each have a shape to corresponding to each corner of the semiconductor device 145. For example, the twentieth to twenty-third supporting elements 371 to 374 may each have a shape surrounding each corner of the semiconductor device 145.

The twentieth to twenty-third supporting elements 371 to 374 may be spaced apart from one another. Spaces between the twentieth and twenty-second supporting elements 371 and 373, and between the twenty-first and twenty-third supporting elements 372 and 374 may function as air paths that pass over the semiconductor device 145 in a vertical direction. In addition, spaces between the twentieth and twenty-first supporting elements 371 and 372, and between the twenty-second and twenty-third supporting elements 373 and 374 may function as air paths that pass over the semiconductor device 145 in a horizontal direction.

The twentieth to twenty-third supporting elements 371 to 374 may each have the same shape when rotating based on a center point of the semiconductor device 145. For example, the twenty-first supporting element 372 may have the same shape as a shape in which the twentieth supporting element 371 is reversed up and down. The twenty-second supporting element 373 may have the same shape as a shape in which the twentieth supporting element 371 is reversed left and right. The twenty-third supporting element 374 may be symmetrically disposed to the twentieth supporting element 371 based on the center point of the semiconductor device 145.

Eighth Embodiment

Figure 10:
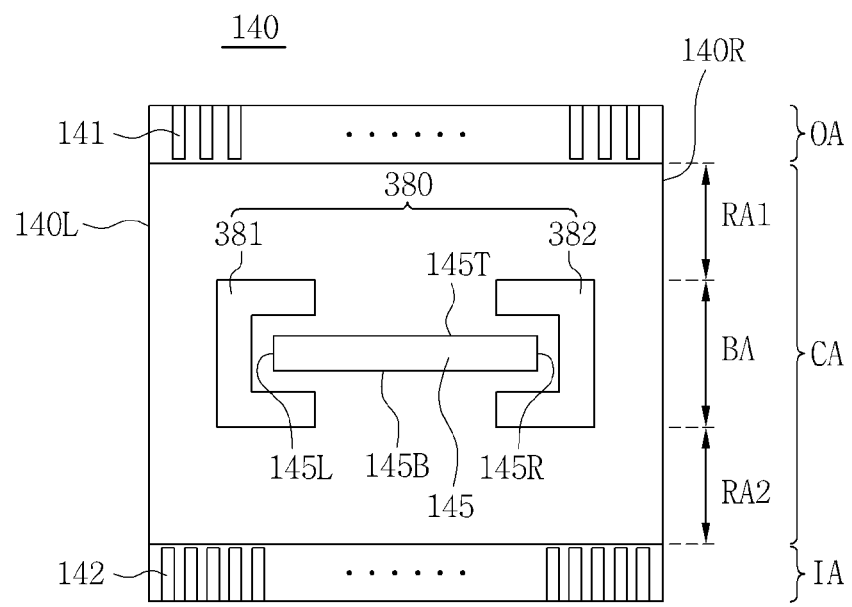
FIG. 10 is a plan view illustrating a flexible printed circuit board and a supporting element of a display device in accordance with some example embodiments.

FIG. 10 is a plan view illustrating a flexible printed circuit board and a supporting element of a display device in accordance with an eighth embodiment of the inventive concept.

Hereinafter, with reference to FIG. 10, a display device according to an eighth embodiment of the inventive concept will be described based on the differences in the display device according to the first embodiment of the inventive concept. Accordingly, a detailed description of the same or similar components in the display device according to the first embodiment of the inventive concept will be omitted.

Referring to FIG. 10, the display device according to the eighth embodiment of the inventive concept may include a flexible printed circuit board 140 on which a semiconductor device 145 is mounted, and a plurality of supporting elements 380 attached to the flexible printed circuit board 140.

The plurality of supporting elements 380 may include a twenty-fourth supporting element 381 surrounding a third side surface 145L of the semiconductor device 145, and a twenty-fifth supporting element 382 surrounding a fourth side surface 145R of the semiconductor device 145. The twenty-fourth supporting element 381 may be symmetrically disposed to the twenty-fifth supporting element 382 based on a center point of the semiconductor device 145. When the twenty-fourth supporting element 381 rotates based on the center point of the semiconductor device 145, the twenty-fourth supporting element 381 may have the same shape as the twenty-fifth supporting element 382.

The twenty-fourth supporting element 381 and the twenty-fifth supporting element 382 may be spaced apart from each other in a horizontal direction. A space between the twenty-fourth and twenty-fifth supporting elements 381 and 382 may function as an air path that passes over the semiconductor device 145 in a vertical direction.

Ninth Embodiment

Figure 11:
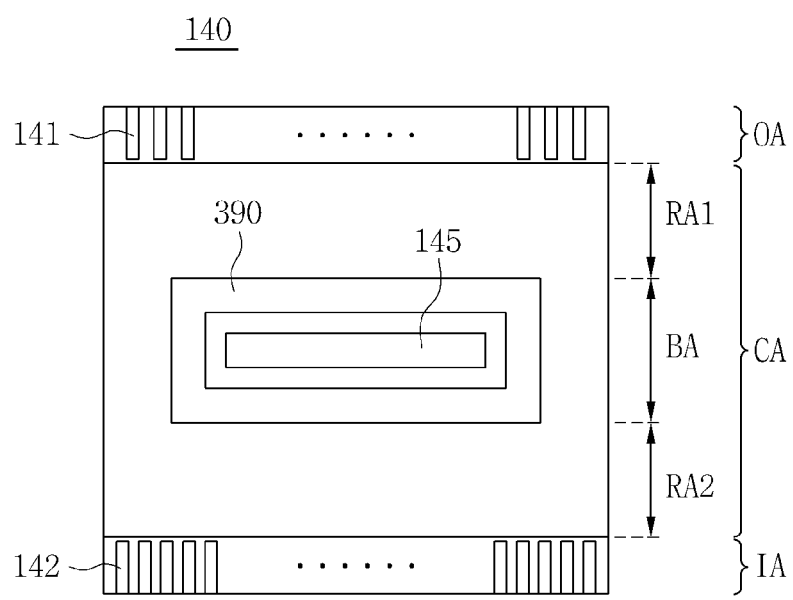
FIG. 11 is a plan view illustrating a flexible printed circuit board and a supporting element of a display device in accordance with some example embodiments.

FIG. 11 is a plan view illustrating a flexible printed circuit board and a supporting element of a display device in accordance with a ninth embodiment of the inventive concept.

Hereinafter, with reference to FIG. 11, a display device according to a ninth embodiment of the inventive concept will be described based on the differences in the display device according to the first embodiment of the inventive concept. Accordingly, a detailed description of the same or similar components in the display device according to the first embodiment of the inventive concept will be omitted.

Referring to FIG. 11, the display device according to the ninth embodiment of the inventive concept may include a flexible printed circuit board 140 on which a semiconductor device 145 is mounted, and a twenty-sixth supporting element 390 attached to the flexible printed circuit board 140.

The twenty-sixth supporting element 390 may surround side surfaces of the semiconductor device 145. The twenty-sixth supporting element 390 may have the same quadrangle shape as the semiconductor device 145. For example, the twenty-sixth supporting element 390 may have a rectangular shape.

Tenth Embodiment

Figure 12:
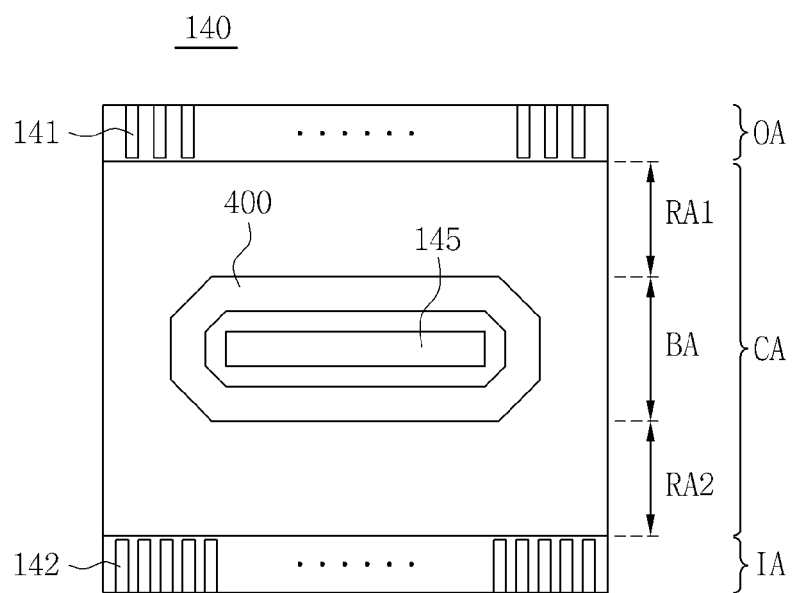
FIG. 12 is a plan view illustrating a flexible printed circuit board and a supporting element of a display device in accordance with some example embodiments.

FIG. 12 is a plan view illustrating a flexible printed circuit board and a supporting element of a display device in accordance with a tenth embodiment of the inventive concept.

Hereinafter, with reference to FIG. 12, a display device according to a tenth embodiment of the inventive concept will be described based on the differences in the display device according to the first embodiment of the inventive concept. Accordingly, a detailed description of the same or similar components in the display device according to the first embodiment of the inventive concept will be omitted.

Referring to FIG. 12, the display device according to the tenth embodiment of the inventive concept may include a flexible printed circuit board 140 on which a semiconductor device 145 is mounted, and a twenty-seventh supporting element 400 attached to the flexible printed circuit board 140.

The twenty-seventh supporting element 400 may be polygonal shape surrounding side surfaces of the semiconductor device 145. The twenty-seventh supporting element 400 may have a different shape from the semiconductor device 145. For example, the twenty-seventh supporting element 400 may have an octagonal shape surrounding the semiconductor device 145 that has a rectangular shape.

Eleventh Embodiment

Figure 13:
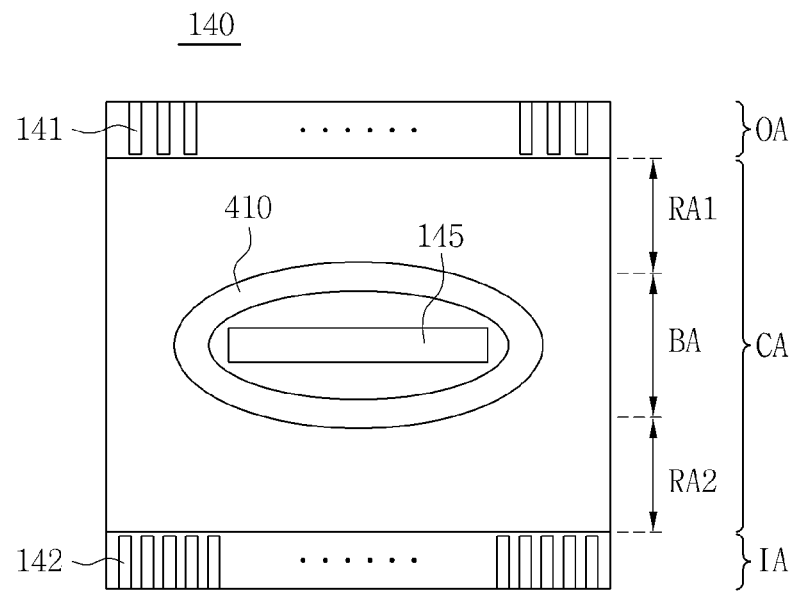
FIG. 13 is a plan view illustrating a flexible printed circuit board and a supporting element of a display device in accordance with some example embodiments.

FIG. 13 is a plan view illustrating a flexible printed circuit board and a supporting element of a display device in accordance with an eleventh embodiment of the inventive concept.

Hereinafter, with reference to FIG. 13, a display device according to an eleventh embodiment of the inventive concept will be described based on the differences in the display device according to the first embodiment of the inventive concept. Accordingly, a detailed description of the same or similar components in the display device according to the first embodiment of the inventive concept will be omitted.

Referring to FIG. 13, the display device according to the eleventh embodiment of the inventive concept may include a flexible printed circuit board 140 on which a semiconductor device 145 is mounted, and a twenty-eighth supporting element 410 attached to the flexible printed circuit board 140. The twenty-eighth supporting element 410 may be elliptical in shape surrounding side surfaces of the semiconductor device 145.

Twelfth Embodiment

Figure 14:
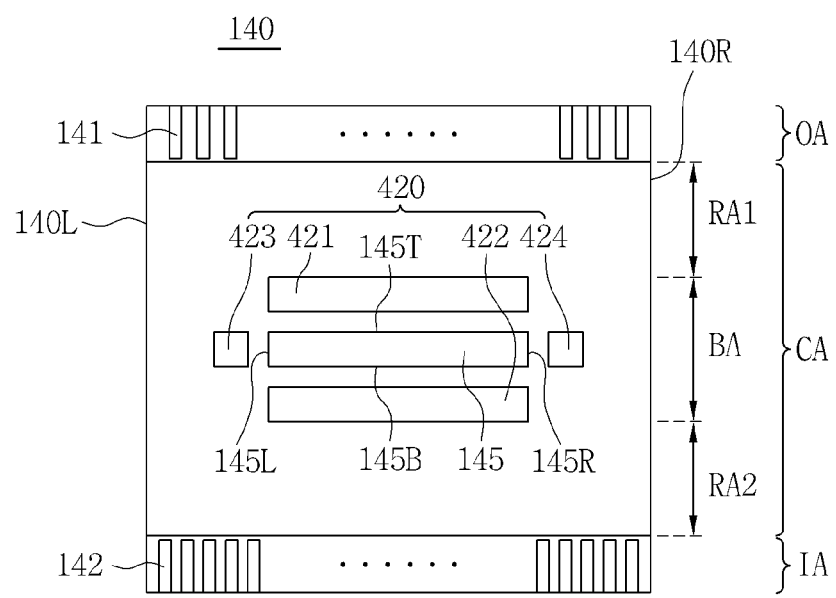
FIG. 14 is a plan view illustrating a flexible printed circuit board and a supporting element of a display device in accordance with some example embodiments.

FIG. 14 is a plan view illustrating a flexible printed circuit board and a supporting element of a display device in accordance with a twelfth embodiment of the inventive concept.

Hereinafter, with reference to FIG. 14, a display device according to a twelfth embodiment of the inventive concept will be described based on the differences in the display device according to the first embodiment of the inventive concept. Accordingly, a detailed description of the same or similar components in the display device according to the first embodiment of the inventive concept will be omitted.

Referring to FIG. 14, the display device according to the twelfth embodiment of the inventive concept may include a flexible printed circuit board 140 on which a semiconductor device 145 is mounted, and a plurality of supporting elements 420 attached to the flexible printed circuit board 140. The plurality of supporting elements 420 may include a twenty-ninth supporting element 421, a thirtieth supporting element 422, a thirty-first supporting element 423 and a thirty-second supporting element 424.

The twenty-ninth supporting element 421 may be disposed near to a first side surface 145T of the semiconductor device 145. The twenty-ninth supporting element 421 may be disposed parallel to the first side surface 145T of the semiconductor device 145. The thirtieth supporting element 422 may be disposed near to a second side surface 145B of the semiconductor device 145. The thirtieth supporting element 422 may be disposed parallel to the second side surface 145B of the semiconductor device 145. The thirty-first supporting element 423 may be disposed near to a third side surface 145L of the semiconductor device 145. The thirty-first supporting element 423 may be disposed parallel to the third side surface 145L of the semiconductor device 145. The thirty-second supporting element 424 may be disposed near to a fourth side surface 145R of the semiconductor device 145. The thirty-second supporting element 424 may be disposed parallel to the fourth side surface 145R of the semiconductor device 145.

The twenty-ninth supporting element 421, the thirtieth supporting element 422, the thirty-first supporting element 423 and the thirty-second supporting element 424 may not overlap one another. For example, the twenty-ninth supporting element 421 may have the same horizontal length as the first side surface 145T of the semiconductor device 145. The thirtieth supporting element 422 may have the same horizontal length as the second side surface 145B of the semiconductor device 145. The thirty-first supporting element 423 may have the same vertical length as the third side surface 145L of the semiconductor device 145. The thirty-second supporting element 424 may have the same vertical length as the fourth side surface 145R of the semiconductor device 145.

Spaces between the twenty-ninth and thirtieth supporting elements 421 and 422, between the thirtieth and thirty-first supporting elements 422 and 423, between the thirty-first and thirty-second supporting elements 423 and 424, and between the thirty-second and twenty-ninth supporting elements 424 and 421 may function as air paths.

Thirteenth Embodiment

Figure 15:
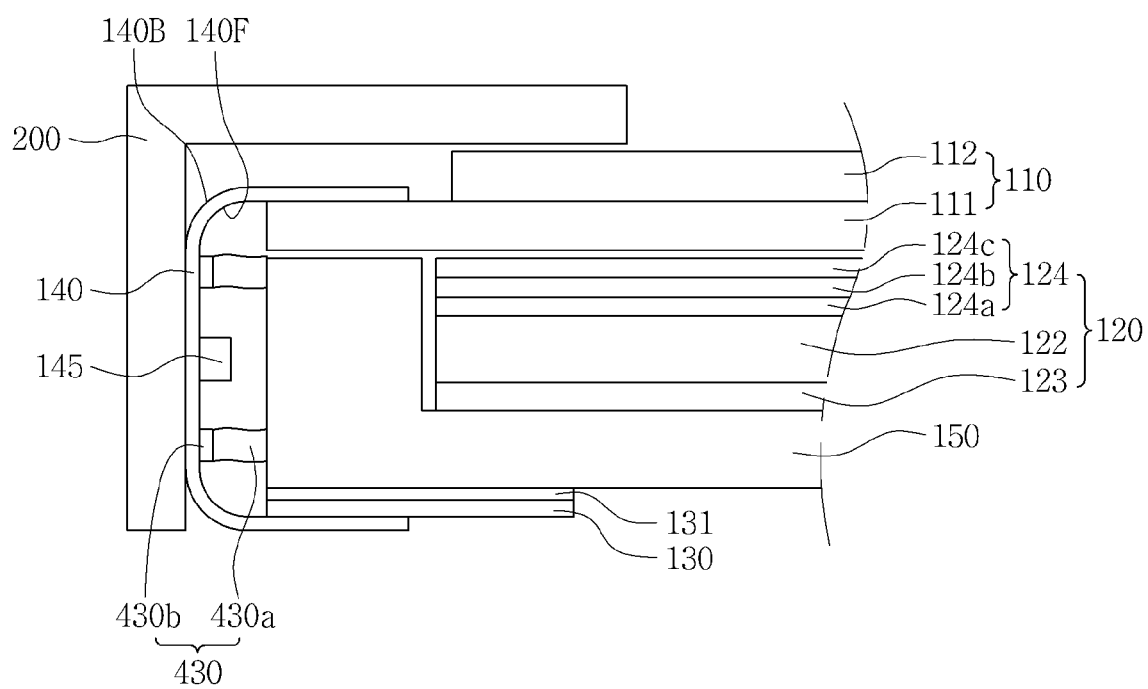
FIG. 15 is a cross-sectional view illustrating a display device in accordance with some example embodiments.

FIG. 15 is a cross-sectional view illustrating a display device in accordance with a thirteenth embodiment of the inventive concept.

Hereinafter, with reference to FIG. 15, a display device according to a thirteenth embodiment of the inventive concept will be described based on the differences in the display device according to the first embodiment of the inventive concept. Accordingly, a detailed description of the same or similar components in the display device according to the first embodiment of the inventive concept will be omitted.

Referring to FIG. 15, the display device in accordance with the thirteenth embodiment of the inventive concept may include a flexible printed circuit board 140 including a first surface 140F and a second surface 140B opposite to the first surface 140F, a semiconductor device 145 mounted on the first surface 140F of the flexible printed circuit board 140, a display panel 110 connected to a side of the flexible printed circuit board 140, a back-light assembly 120 disposed under the display panel 110, a mold frame 150 configured to receive the back-light assembly 120, a driving circuit board 130 connected to another side of the flexible printed circuit board 140, a chassis 200 configured to cover a side surface of the display panel 110 and in contact with the second surface 140B of the flexible printed circuit board 140, and a plurality of supporting elements 430 attached onto the first surface 140F of the flexible printed circuit board 140.

The display panel 110 may include a first board 111 and a second board 112 which are connected to each other. The back-light assembly 120 may include a light source part 121, a light guide plate 122, a reflecting plate 123, and at least one optical sheet 124. The at least one optical sheet 124 may include a diffuser sheet 124a, a prism sheet 124b, and a protecting sheet 124c. The driving circuit board 130 may be attached onto a lower portion of the mold frame 150 using an adhesive element 131.

The plurality of supporting elements 430 may include a supporting body 430a, and an adhesive layer 430b disposed between the supporting body 430a and the flexible printed circuit board 140. The supporting body 430a may be in contact with a side surface of the mold frame 150. The supporting body 430a may include elastic materials. The plurality of supporting elements 430 may be an adhesive tape.

Fourteenth Embodiment

Figure 16:
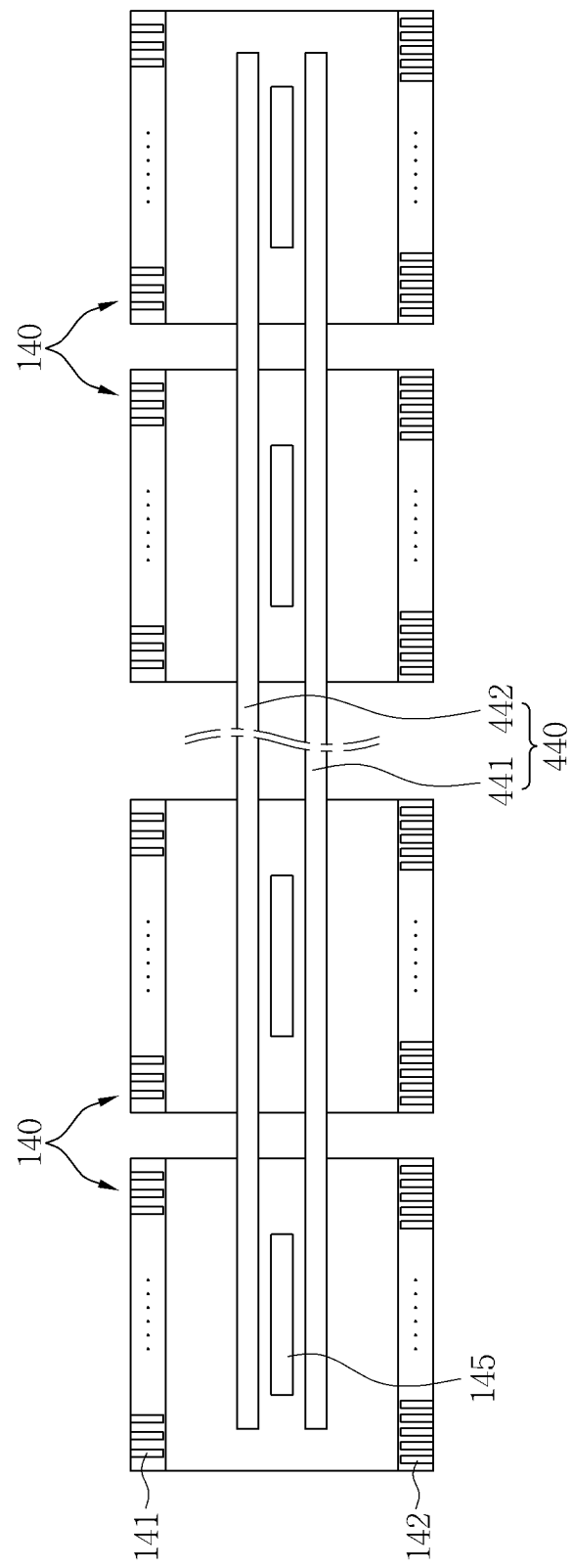
FIG. 16 is a plan view illustrating a flexible printed circuit board and a supporting element of a display device in accordance with some example embodiments.

FIG. 16 is a plan view illustrating a flexible printed circuit board and a supporting element of a display device in accordance with a fourteenth embodiment of the inventive concept.

Hereinafter, with reference to FIG. 16, a display device according to a fourteenth embodiment of the inventive concept will be described based on the differences in the display device according to the first embodiment of the inventive concept. Accordingly, a detailed description of the same or similar components in the display device according to the first embodiment of the inventive concept will be omitted.

Referring to FIG. 16, the display device according to the fourteenth embodiment of the inventive concept may include a plurality of flexible printed circuit boards 140 which are arranged parallel to one another and a plurality of supporting elements 440 attached onto the flexible printed circuit board 140.

The plurality of supporting elements 440 may include a thirty-third supporting element 441 and a thirty-fourth supporting element 442 arranged parallel to the semiconductor device 145 mounted on the flexible printed circuit board 140. The flexible printed circuit board 140 may be connected to one another through the thirty-third and thirty-fourth supporting elements 441 and 442. For example, the thirty-third and thirty-fourth supporting elements 441 and 442 may be extended in a direction in which the plurality of flexible printed circuit boards 140 are arranged. The plurality of flexible printed circuit boards 140 may be in contact with the thirty-third and thirty-fourth supporting elements 441 and 442.

Fifteenth Embodiment

Figure 17:
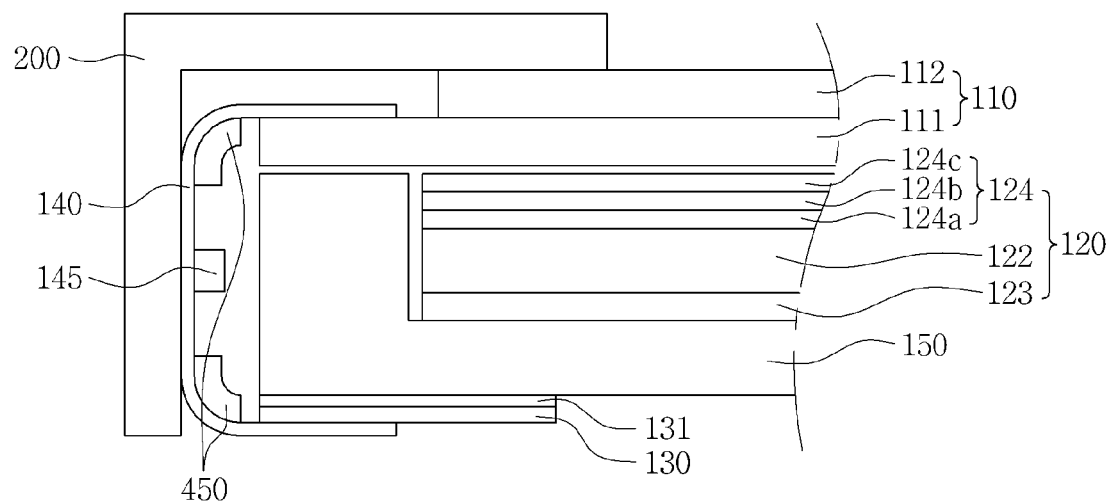
FIG. 17 is a cross-sectional view illustrating a display device in accordance with some example embodiments.
Figure 18:
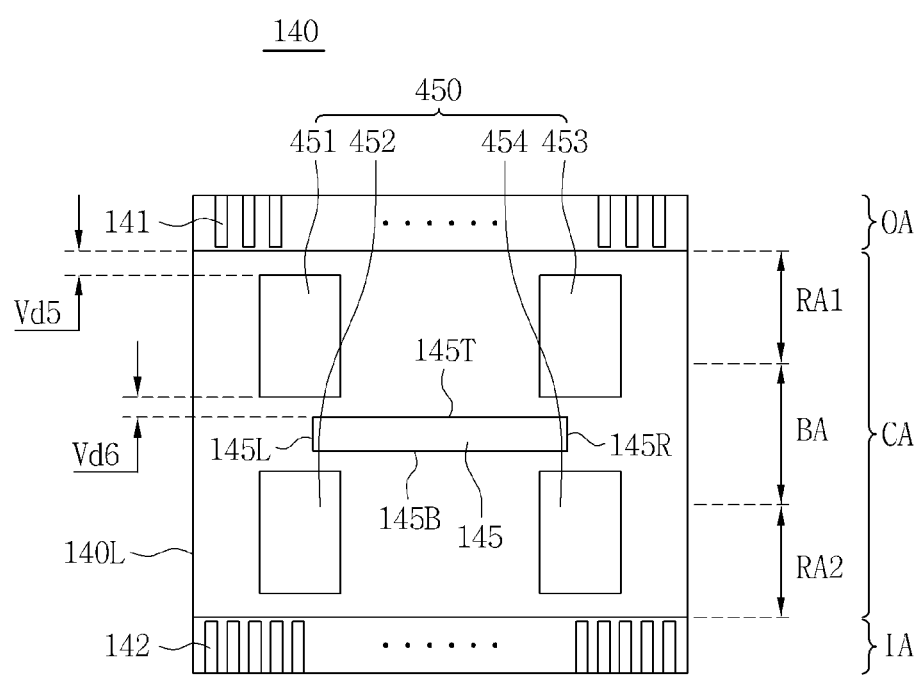
FIG. 18 is a plan view illustrating a flexible printed circuit board and a supporting element of a display device in accordance with some example embodiments.

FIG. 17 is a cross-sectional view illustrating a display device in accordance with a fifteenth embodiment of the inventive concept. FIG. 18 is a plan view illustrating a flexible printed circuit board and a supporting element of a display device in accordance with a fifteenth embodiment of the inventive concept.

Hereinafter, with reference to FIG. 17, a display device according to an fifteenth embodiment of the inventive concept will be described based on the differences in the display device according to the first embodiment of the inventive concept. Accordingly, a detailed description of the same or similar components in the display device according to the first embodiment of the inventive concept will be omitted.

Referring to FIGS. 17 and 18, the display device in accordance with the fifteenth embodiment of the inventive concept may include a flexible printed circuit board 140 on which a semiconductor device 145 is mounted, a display panel 110 connected to a side of the flexible printed circuit board 140, a driving circuit board 130 connected to another side of the flexible printed circuit board 140, a chassis 200 configured to cover a side surface of the display panel 110 and in contact with the flexible printed circuit board 140, and a plurality of supporting elements 450 attached to the flexible printed circuit board 140.

A back-light assembly 120 and a mold frame 150 configured to receive the back-light assembly 120 may be disposed under the display panel 110. The back-light assembly 120 may include a light source part 121, a light guide plate 122, a reflecting plate 123, and at least one optical sheet 124. The at least one optical sheet 124 may include a diffuser sheet 124a, a prism sheet 124b, and a protecting sheet 124c. The driving circuit board 130 may be attached to a lower portion of the mold frame 150 using an adhesive element 131.

The plurality of supporting elements 450 may not be in contact with side surfaces of the mold frame 150. The plurality of supporting elements 450 may add an elastic force to a first rounding region RA1 and a second rounding region RA2 of the flexible printed circuit board 140. The plurality supporting element 450 may add an elastic force so that the first rounding region RA1 and a second rounding region RA2 of the flexible printed circuit board 140 unfurl into a flat shape. The mounting region BA of the flexible printed circuit board 140 may be pushed toward the chassis 200 due to the elastic force added to the first rounding region RA1 and the second rounding region RA2. The mounting region BA of the flexible printed circuit board 140 may be pressurized toward the chassis 200 by the plurality of supporting elements 450.

The plurality of supporting elements 450 may include a thirty-fifth supporting element 451, a thirty-sixth supporting element 452, a thirty-seventh supporting element 453 and a thirty-eighth supporting element 454. The thirty-fifth to thirty-eighth supporting elements 451 to 454 may be disposed at respective corners of the semiconductor device 145.

The thirty-fifth supporting element 451 and the thirty-seventh supporting element 453 may be extended up to the first rounding region RA1 of the flexible printed circuit board 140. For example, a distance between the thirty-fifth supporting element 451 and a first region OA may be a fifth vertical distance Vd5. The fifth vertical distance Vd5 may be the same as a sixth vertical distance Vd6 between the thirty-fifth supporting element 451 and a first side surface 145T of the semiconductor device 145. The thirty-sixth supporting element 452 and the thirty-eighth supporting element 454 may be extended up to the second rounding region RA2 of the flexible printed circuit board 140.

Sixteenth Embodiment

Figure 19:
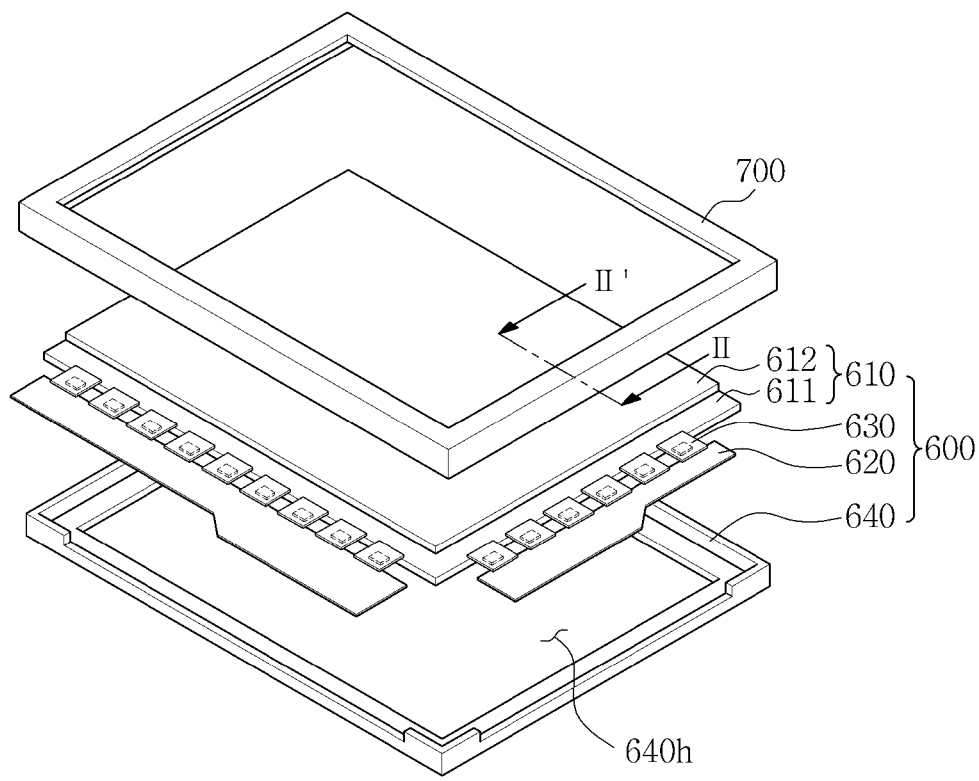
FIG. 19 is an exploded perspective view illustrating a display device in accordance with some example embodiments.
Figure 20:
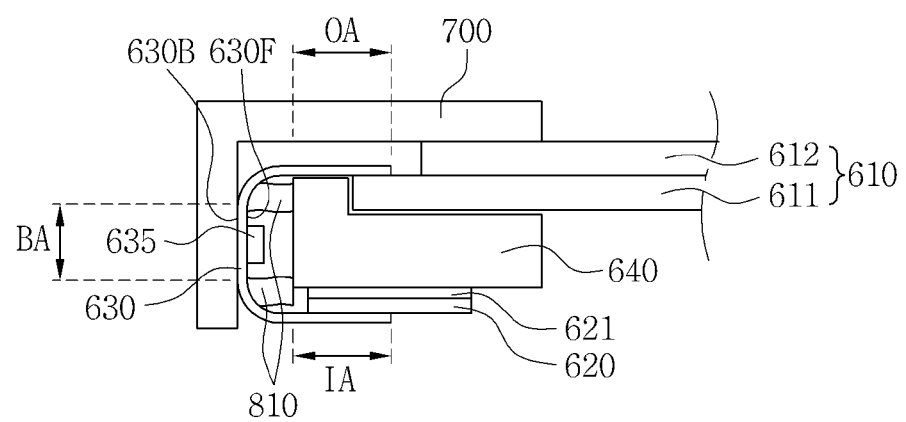
FIG. 20 is a cross-sectional view taken along line II-II' of FIG. 19.

FIG. 19 is an exploded perspective view illustrating a display device in accordance with a sixteenth embodiment of the inventive concept. FIG. 20 is a cross-sectional view taken along line II-II' of FIG. 19.

Hereinafter, with reference to FIGS. 19 and 20, a display device according to an sixteenth embodiment of the inventive concept will be described based on the differences in the display device according to the first embodiment of the inventive concept. Accordingly, a detailed description of the same or similar components in the display device according to the first embodiment of the inventive concept will be omitted.

Referring to FIGS. 19 and 20, the display device in accordance with the sixteenth embodiment of the inventive concept may include a flexible printed circuit board 630 including a first surface 630F and a second surface 630B opposite to the first surface 630F, a semiconductor device 635 mounted on the first surface 630F of the flexible printed circuit board 630, a display panel 610 connected to a side of the flexible printed circuit board 630, a driving circuit board 620 connected to another side of the flexible printed circuit board 630, a chassis 700 configured to cover a side surface of the display panel 610 and in contact with the second surface 630B of the flexible printed circuit board 630, a mold frame 640 configured to receive the display panel 610, and a plurality of supporting elements 810 disposed between the first surface 630F of the flexible printed circuit board 630 and the display panel 610 and spaced apart from the semiconductor device 635.

The display panel 610 may include a third circuit board 611 and a fourth circuit board 612 which are connected to each other. The third circuit board 611 may include a plurality of thin film transistors and organic electroluminescence materials. The fourth circuit board 612 may seal the organic electroluminescence materials of the third circuit board 611. The display panel 610 may be an organic electroluminescence panel.

The mold frame 640 may cover a portion of the side surface of the display panel 610. For example, the mold frame 640 may cover a side surface of the third circuit board 611 of the display panel 610. The mold frame 640 may include a hole 640h that exposes a portion of a lower surface of the display panel 610. The driving circuit board 620 may be attached onto the mold frame 640 by an adhesive element 621.

The plurality of supporting elements 810 may be disposed on the outside of a mounting region BA of the flexible printed circuit board 630. The plurality of supporting elements 810 may be disposed between the mounting region BA of the flexible printed circuit board 630 and the display panel 610. In addition, the plurality of supporting elements 810 may be disposed between the mounting region BA of the flexible printed circuit board 630 and the driving circuit board 620. The plurality of supporting elements 810 may be in contact with side surfaces of the mold frame 640.

Seventeenth Embodiment

Figure 21:
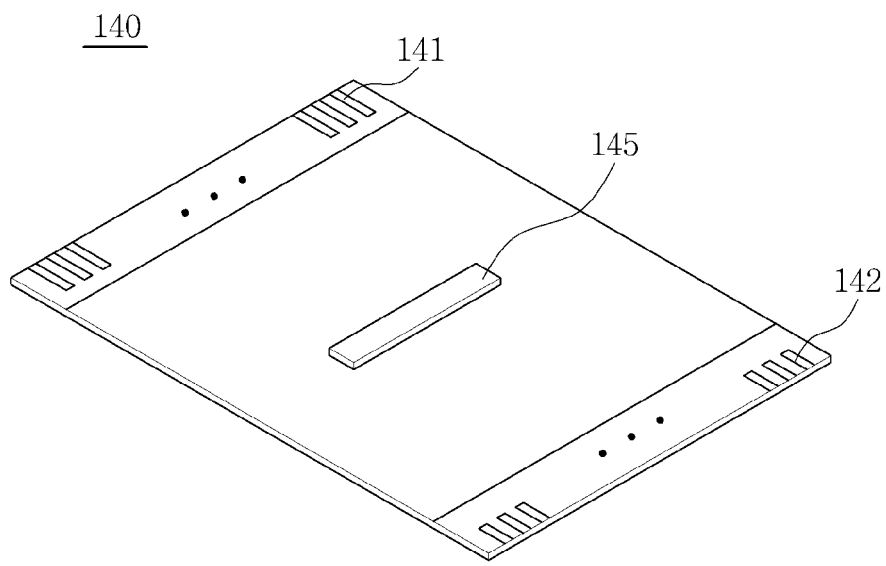
FIGS. 21 and 22 are perspective views illustrating a method of forming a supporting element on a flexible printed circuit board of a display device in accordance with some example embodiments.
Figure 22:
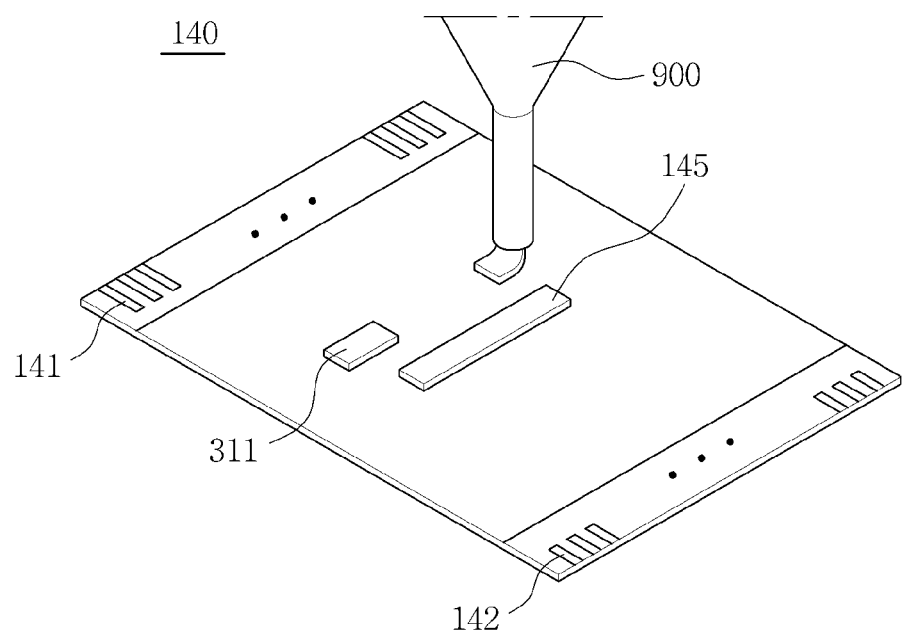

FIGS. 21 and 22 are perspective views sequentially illustrating a method of forming a supporting element on a flexible printed circuit board of a display device in accordance with a first embodiment of the inventive concept.

Referring to FIGS. 1, 2, 3, 21 and 22, a method of fabricating the display device in accordance with the first embodiment of the inventive concept is described. First, in the method of fabricating the display device in accordance with the first embodiment of the inventive concept, as shown in FIG. 21, a flexible printed circuit board 140 including a first terminal 142, a second terminal 141, and a semiconductor device 145 mounted between the first terminal 141 and the second terminal 142 is provided.

Subsequently, in the method of fabricating the display device in accordance with the first embodiment of the inventive concept, as shown in FIG. 22, supporting element material near the semiconductor device 145 of the flexible printed circuit board 140 using a coating apparatus 900 may be coated. The supporting element material may include elastic materials. The supporting element material may be cured at room temperature and become a plurality of supporting elements 310 including a first supporting element 311.

Next, in the method of fabricating the display device in accordance with the first embodiment of the inventive concept, as shown in FIGS. 1, 2 and 3, a display panel 110 may be connected to the first terminal 141 of the flexible printed circuit board 140, and a driving circuit board 130 may be connected to the second terminal 142 of the flexible printed circuit board 140. A back-light assembly 120 and a mold frame 150 may be disposed under the display panel 110.

Continuously, in the method of fabricating the display device in accordance with the first embodiment of the inventive concept, the flexible printed circuit board 140 may be rounded along a side surface of the display panel 110. The driving circuit board 130 may be disposed on the lower portion of the back-light assembly 120.

The plurality of supporting elements 310 may be pressurized to the side surface of the back-light assembly 120 due to the rounding of the flexible printed circuit board 140. The flexible printed circuit board 140 may be pushed toward the outside of the back-light assembly 120 through the plurality of supporting elements 310. The plurality of supporting elements 310 may maintain spaces between the back-light assembly 120 and the flexible printed circuit board 140.

Finally, in the method of fabricating the display device in accordance with the first embodiment of the inventive concept, it is possible to couple a chassis 200 covering side surfaces of the display panel 110. The chassis 200 may be in contact with a second surface 140B of the flexible printed circuit board 140. Contact between the flexible printed circuit board 140 and the chassis 200 may be maintained by the plurality of supporting elements 310.

Eighteenth Embodiment

Figure 23:
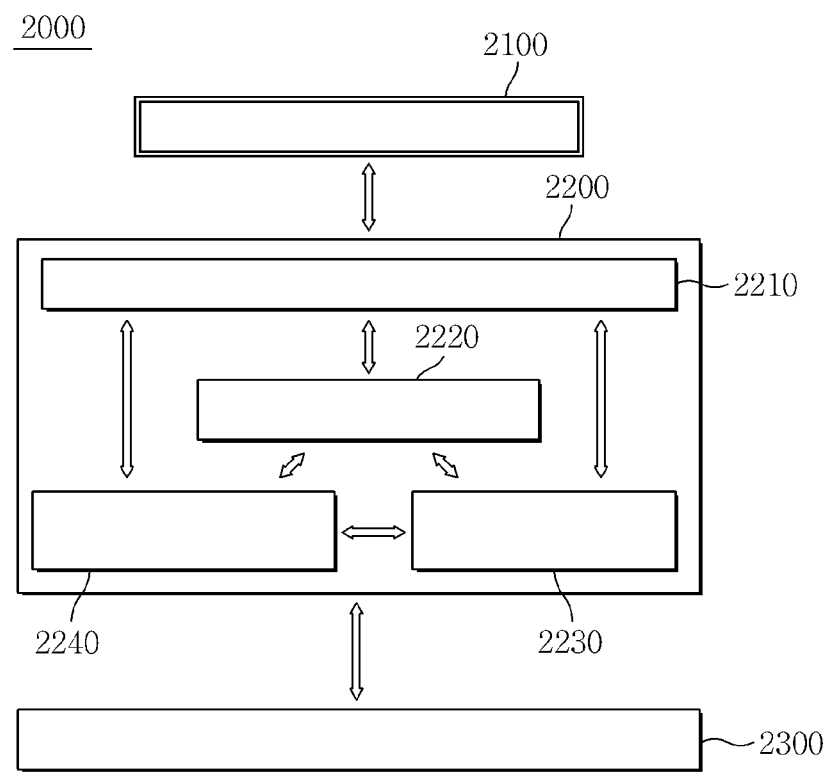
FIG. 23 is a configuration diagram illustrating a display system including a display device in accordance with some example embodiments.

FIG. 23 is a configuration diagram illustrating a display system including a display device in accordance with the inventive concept.

Referring to 23, a display system 2000 may include a display device 2100, a control circuit 2200 connected to the display device 2100, and an external device 2300 connected to the control circuit 2200. The display system 2000 may be used in portable electronic/electrical equipment such as cell phones and tablet personal computers (PCs).

The display device 2100 may implement certain images according to image signals. The display device 2100 may be a display device including the flexible printed circuit board on which the semiconductor device is mounted and the supporting member, in accordance with the embodiment of the inventive concept. The display devices and fabrication methods as described referring to FIGS. 1 to 22 may be applied to the display device 2100. For example, the display device 2100 may be a display device including the plurality of supporting elements 310 in accordance with the first embodiment of the inventive concept. Accordingly, the display system may have improved reliability and stability.

The control circuit 2200 may apply the image signal to the display device 2100. The control circuit 2200 may include a display controller 2210, a microprocessor 2220, a functional unit 2230, and a power unit 2240.

The display controller 2210 may control the display device 2100 according to the image signal. The microprocessor 2220 may generate and extract image signals suitable for the display device 2100. The functional unit 2230 may perform additional functions according to the image signal. The power unit 2240 may supply power to the display controller 2210, the microprocessor 2220 and the functional unit 2230.

The external device 2300 may apply an external signal to the control circuit 2200. The external signal may be input signals from a user or peripherals. The external signal may include an image signal and an audio signal. The external signals may further include various signals performed by the functional unit 2230 of the control circuit 2200.

Nineteenth Embodiment

Figure 24:
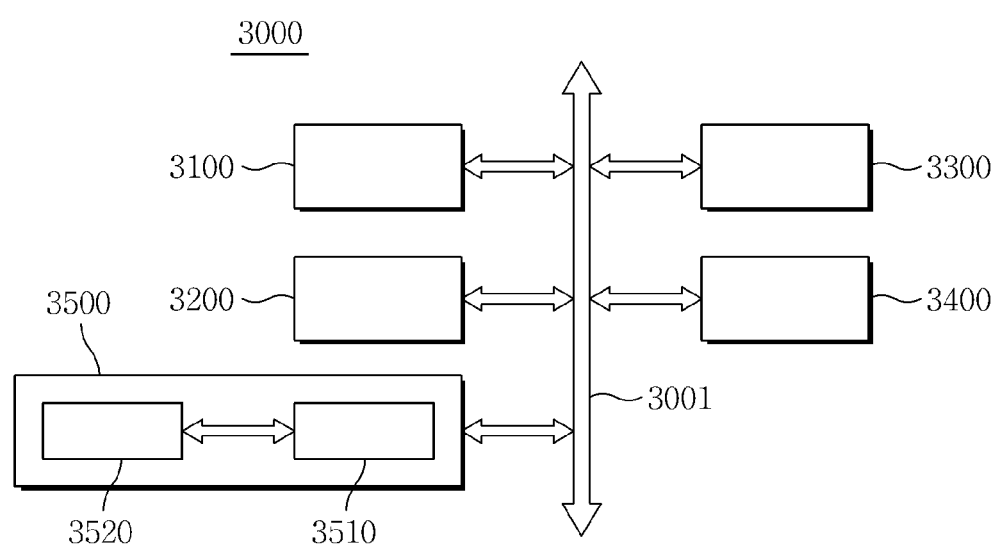
FIG. 24 is a configuration diagram illustrating an electronic system including a display device in accordance with some example embodiments.

FIG. 24 is a configuration diagram illustrating an electronic system including a display device in accordance with the inventive concept.

Referring to FIG. 24, an electronic system 3000 including the display device in accordance with the inventive concept may include an interface 3100, a memory system 3200, an input/output device 3300, a central processing unit 3400, and a display system 3500.

The electronic system 3000 may include a personal digital assistant (PDA), a portable computer, a web tablet, a wireless phone, a mobile phone, or a digital music player. In addition, the electronic system 3000 may include a desktop computer and a television including a flat panel display device.

The interface 3100, the memory system 3200, the input/output device 3300, and the central processing unit 3400 may be electrically connected to one another through a bus 3001. The interface 3100 may exchange data with the external system. The memory system 3200 may store the data exchanged through the interface 3100. The memory system 3200 may include a volatile memory and a non-volatile memory. The central processing unit 3400 may include a microprocessor, a digital processor, or a microcontroller.

The display system 3500 may implement a certain image and a certain function according to an external signal applied by the central processing unit 3400. The certain function may include audio according to the certain image. The display system 3500 may include a control unit 3510 configured to generate and extract proper image signals using the external signal applied from the central processing unit 3400, and a display device 3520 configured to implement the certain image according to the image signal applied from the control unit 3510.

The control unit 3510 may perform additional functions according to the image signal included in the external signal. The display device 3520 may be a display device including the flexible printed circuit board on which the semiconductor device is mounted, in accordance with the embodiment of the inventive concept. For example, the display device 3520 may be a display device in accordance with the first embodiment of the inventive concept. The display device 3520 may include a plurality of supporting elements attached onto the flexible printed circuit board. Accordingly, the display device 3520 may have enhanced reliability and stability by improving heat dissipation efficiency of the semiconductor device.

Therefore, in a display device in accordance with the inventive concepts, a supporting element spaced apart from a semiconductor device is attached to a first surface of a flexible printed circuit board. Heat dissipation efficiency of the semiconductor device mounted on the first surface of the flexible printed circuit board can be improved due to the supporting member. Therefore, in accordance with the inventive concept, it is possible to improve reliability and stability of the display device.

The foregoing is illustrative of embodiments and is not to be construed as limiting thereof. Although a few embodiments have been described, those skilled in the art will readily appreciate that many modifications are possible in embodiments without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A display device, comprising:
    a display assembly including a display panel, a flexible printed circuit board bending along a side surface of the display panel, and a semiconductor device mounted on a first surface of the flexible printed circuit board, the first surface of the flexible printed circuit board facing the side surface of the display panel;
    a chassis configured to cover a side surface of the display assembly, the chassis being in contact with a second surface of the flexible printed circuit board, the second surface of the flexible printed circuit board being opposite to the first surface of the flexible printed circuit board; and
    a supporting element attached to the first surface of the flexible printed circuit board.

2. The display device according to claim 1, wherein the flexible printed circuit board further includes:
    a first region including a first terminal;
    a second region including a second terminal; and
    a mounting region between the first region and the second region;
    wherein the semiconductor device is mounted on the first surface of the mounting region, and
    wherein the chassis is in contact with the second surface of the mounting region.

3. The display device according to claim 2, wherein the display assembly further includes:
    a display panel connected to the first terminal; and
    a driving circuit board connected to the second terminal; and
    wherein the driving circuit board is on a rear surface of the display panel.

4. The display device according to claim 3, wherein the display assembly further includes:
    a back-light assembly between the display panel and the driving circuit board; and
    a mold frame configured to receive the back-light assembly; and
    wherein the supporting element is in contact with a side surface of the mold frame.

5. The display device according to claim 1, wherein the supporting element includes:
    a supporting body; and
    an adhesive layer; and
    wherein the adhesive layer is between the supporting body and the first surface of the flexible printed circuit board.

6. The display device according to claim 1, wherein the supporting element includes elastic material.

7. The display device according to claim 1, wherein the supporting element includes at least one air path.

8. A display device, comprising:
    a flexible printed circuit board including a first surface and a second surface, the second surface being opposite to the first surface;
    a semiconductor device mounted on the first surface of the flexible printed circuit board;
    a display panel connected to an end side of the flexible printed circuit board;
    a driving circuit board connected to another end side of the flexible printed circuit board;
    a chassis configured to cover a side surface of the display panel, the chassis being in contact with the second surface of the flexible printed circuit board; and
    a first supporting element between the first surface of the flexible printed circuit board and the display panel, the first supporting element being spaced apart from the semiconductor device.

9. The display device according to claim 8, wherein the semiconductor device includes:
    a first side surface toward the end side of the flexible printed circuit board;
    a second side surface opposite to the first side surface;
    a third side surface toward a lateral side surface of the flexible printed circuit board; and
    a fourth side surface opposite to the third side surface;
    wherein the first supporting element is near the first side surface of the semiconductor device.

10. The display device according to claim 9, further comprising:
    a second supporting element near the second side surface of the semiconductor device.

11. The display device according to claim 10, wherein the second supporting element is symmetrical to the first supporting element based on an imaginary line that divides the semiconductor device in half in a horizontal direction.

12. The display device according to claim 10, further comprising:
    a third supporting element near the first side surface of the semiconductor device; and
    a fourth supporting element near the second side surface of the semiconductor device;
    wherein the third supporting element is spaced apart from the first supporting element, and
    wherein the fourth supporting element is spaced apart from the second supporting element.

13. The display device according to claim 12, wherein the third and fourth supporting elements are symmetrical to the first and second supporting elements based on an imaginary line that divides the semiconductor device in half in a vertical direction.

14. The display device according to claim 9, wherein a vertical distance between the first supporting element and the first side surface of the semiconductor device is smaller than a vertical distance between the first supporting element and the display panel.

15. The display device according to claim 8, wherein a horizontal length of the first supporting element is greater than a horizontal length of the semiconductor device.

16. A display device, comprising:
a chassis;
a flexible printed circuit board on the chassis;
a semiconductor device on the flexible printed circuit board; and
a supporting element on the flexible printed circuit board;
wherein the semiconductor device is spaced apart from the supporting element, and
wherein the supporting element is configured to maintain contact between the chassis and the flexible printed circuit board.

17. The display device according to claim 16, wherein the flexible printed circuit board includes a first surface and a second surface,
wherein the semiconductor device and the supporting element are on the first surface, and
wherein the supporting element is configured to maintain contact between the chassis and the second surface of the flexible printed circuit board.

18. The display device according to claim 16, wherein the supporting element is thicker than the semiconductor device.

19. The display device according to claim 16, wherein the supporting element is symmetrical based on an imaginary line that divides the semiconductor device in half in a vertical direction.

20. The display device according to claim 16, wherein the supporting element surrounds the side surfaces of the semiconductor device.

* * * * *